(12) United States Patent
Suzuki et al.

(10) Patent No.: US 10,781,312 B2
(45) Date of Patent: Sep. 22, 2020

(54) THERMALLY CONDUCTIVE MEMBER AND METHOD FOR PRODUCING THERMALLY CONDUCTIVE MEMBER

(71) Applicant: Kitagawa Industries Co., Ltd., Aichi (JP)

(72) Inventors: Tomoyuki Suzuki, Kasugai (JP); Yasuo Kondo, Kasugai (JP); Takashi Mizuno, Kasugai (JP); Yasuhiro Kawaguchi, Kasugai (JP); Satoshi Deguchi, Kasugai (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 252 days.

(21) Appl. No.: 16/074,810

(22) PCT Filed: Jan. 27, 2017

(86) PCT No.: PCT/JP2017/002865
§ 371 (c)(1),
(2) Date: Aug. 2, 2018

(87) PCT Pub. No.: WO2017/135158
PCT Pub. Date: Aug. 10, 2017

(65) Prior Publication Data
US 2020/0165453 A1    May 28, 2020

(30) Foreign Application Priority Data

Feb. 5, 2016    (JP) .................................. 2016-020828

(51) Int. Cl.
| C08L 83/04 | (2006.01) |
| C08K 3/013 | (2018.01) |
| C08K 3/22 | (2006.01) |
| C08K 3/28 | (2006.01) |
| C08K 3/38 | (2006.01) |
| C08K 3/14 | (2006.01) |
| C08J 5/18 | (2006.01) |
| C08K 3/34 | (2006.01) |

(52) U.S. Cl.
CPC ................ *C08L 83/04* (2013.01); *C08J 5/18* (2013.01); *C08K 3/013* (2018.01); *C08K 3/14* (2013.01); *C08K 3/22* (2013.01); *C08K 3/28* (2013.01); *C08K 3/34* (2013.01); *C08K 3/38* (2013.01); *C08K 2003/2227* (2013.01); *C08K 2003/282* (2013.01); *C08K 2003/385* (2013.01); *C08K 2201/003* (2013.01); *C08K 2201/016* (2013.01); *C08L 2201/00* (2013.01)

(58) Field of Classification Search
CPC ... C08J 5/18; C08K 3/013; C08K 3/14; C08K 3/22; C08K 3/28; C08K 3/34; C08L 83/04
See application file for complete search history.

(56) References Cited

U.S. PATENT DOCUMENTS

2011/0163460 A1    7/2011    Kato et al.

FOREIGN PATENT DOCUMENTS

| CN | 103849356 | 6/2014 |
| JP | 2001-139733 | 5/2001 |
| JP | 2003-183498 | 7/2003 |
| JP | 2003-197833 | 7/2003 |
| JP | 2004-6981 | 1/2004 |
| JP | 2004-210856 | 7/2004 |
| JP | 2010-13521 | 1/2010 |
| JP | 2010-59237 | 3/2010 |

OTHER PUBLICATIONS

International Search Report dated Feb. 21, 2017 in International Application No. PCT/JP2017/002865.

*Primary Examiner* — Edward J Cain
(74) *Attorney, Agent, or Firm* — Wenderoth, Lind & Ponack, L.L.P.

(57) ABSTRACT

Provided is a thermally conductive member having excellent thermal resistance and insulating properties. The thermally conductive member includes a silicone resin, a thermally conductive filler having a larger particle diameter from 30 um to 100 μm, a thermally conductive filler having a smaller particle diameter of not greater than 10 um, and mica having a particle diameter of not greater than 10 um and an aspect ratio of not greater than 50. The mica is added at a ratio of from 0.9 to 11 parts by mass relative to 100 parts by mass of the silicone resin.

13 Claims, 1 Drawing Sheet

THERMALLY CONDUCTIVE MEMBER AND METHOD FOR PRODUCING THERMALLY CONDUCTIVE MEMBER

TECHNICAL FIELD

The present invention relates to a thermally conductive member and a method for producing a thermally conductive member.

BACKGROUND ART

A thermally conductive member including a silicone resin filled with silicon carbide as a thermally conductive filler has been known (for example, see Patent Literature 1). Such a thermally conductive member is disposed in contact with a heating element such as an electronic component and used, to promote heat dissipation from the heating element. Specifically, a sheet-shaped thermally conductive member is interposed between a heating element and a heat sink and used.

Meanwhile, in recent years, attention has been paid to a next-generation power semiconductor using silicon carbide (SiC) or the like. Such a power semiconductor can be used at a high temperature at which use of the power semiconductor has not been realized (for example, not lower than 200° C.). Moreover, the maximum heating temperature is expected to be not lower than 250° C. in the future.

CITATION LIST

Patent Literature

Patent Literature 1: Japanese Unexamined Patent Application Publication No. 2004-6981A

Technical Problem

A known thermally conductive member has a problem in insulating properties that is not secured when the thermally conductive member is used at the high temperature described above.

SUMMARY OF INVENTION

An object of the present invention is to provide a thermally conductive member having excellent thermal resistance and insulating properties and a method for producing the same.

Solution to Problem

The present inventors have earnestly studied to achieve the object, and as a result, have found that a thermally conductive member including a silicone resin, a thermally conductive filler having a larger particle diameter from 30 µm to 100 µm, a thermally conductive filler having a smaller particle diameter of not greater than 10 µm, and mica having a particle diameter of not greater than 10 µm and an aspect ratio of not greater than 50, wherein the mica is added at a ratio of from 0.9 to 11 parts by mass relative to 100 parts by mass of the silicone resin, has excellent thermal resistance and insulating properties. The present invention has been completed.

In the thermally conductive member, it is preferable that a total filling amount of the thermally conductive filler having a larger particle diameter and the thermally conductive filler having a smaller particle diameter relative to whole volume of the thermally conductive member be from 50 to 60 vol. %, and a filling ratio by volume of the thermally conductive filler having a larger particle diameter to the thermally conductive filler having a smaller particle diameter be from 2:3 to 4:1.

In thermally conductive member, it is preferable that the thermally conductive filler having a smaller particle diameter include silicon carbide.

In the thermally conductive member, it is preferable that the thermally conductive filler having a larger particle diameter include at least one selected from the group consisting of low soda alumina, aluminum nitride, and boron nitride.

In the thermally conductive member, it is preferable that the low soda alumina contain soluble sodium in an amount of not greater than 100 ppm.

Moreover, a method for producing a thermally conductive member of the present invention includes adding and mixing a thermally conductive filler having a larger particle diameter from 30 µm to 100 µm, a thermally conductive filler having a smaller particle diameter of not greater than 10 µm, and mica having a particle diameter of not greater than 10 µm and an aspect ratio of not greater than 50 into an uncured silicone resin, to obtain a mixture, and curing the mixture to obtain a thermally conductive member including a cured product of the mixture.

Advantageous Effects of Invention

The present invention can provide a thermally conductive member having excellent thermal resistance and insulating properties and a method for producing the same.

DESCRIPTION OF EMBODIMENTS

A thermally conductive member of the present invention includes a silicone resin (silicone rubber) as a base material, a thermally conductive filler having a larger particle diameter from 30 µm to 100 µm, a thermally conductive filler having a smaller particle diameter of not greater than 10 µm, and mica having a particle diameter of not greater than 10 µm and an aspect ratio of not greater than 50.

Figure 1:
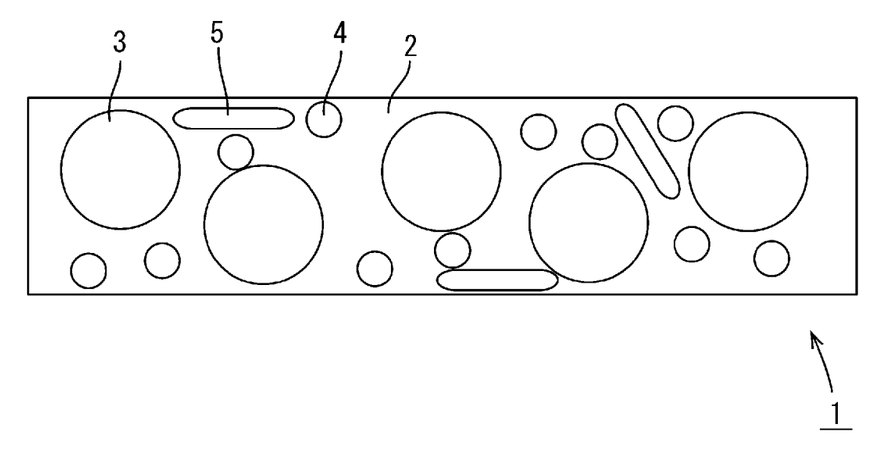
FIG. 1 is a cross-sectional view schematically illustrating a configuration of a thermally conductive member according to an embodiment of the present invention.

FIG. 1 is a cross-sectional view schematically illustrating a configuration of a thermally conductive member 1 according to an embodiment of the present invention. The thermally conductive member 1 illustrated in FIG. 1 has a sheet shape. The thermally conductive member 1 includes a silicone resin 2 as a base material, and a thermally conductive filler having a larger particle diameter 3, a thermally conductive filler having a smaller particle diameter 4, and mica 5 dispersed in the silicone resin 2.

As the silicone resin, a silicone resin generally known as a silicone rubber is used. An example of a commercially available silicone resin include trade name "CY52-276A/B" (available from Dow Corning Toray Co., Ltd.) as a two-part curing silicone resin. Note that to the silicone resin, a curing-retarding agent or the like may be added, as necessary.

The thermally conductive filler having a larger particle diameter includes a thermally conductive filler having a particle diameter from 30 µm to 100 µm. The thermally conductive filler having a larger particle diameter has a substantially spherical shape. The particle diameter of the thermally conductive filler having a larger particle diameter is represented by an average particle diameter $D_{50}$ determined by a laser diffraction process or the like.

Specific examples of the thermally conductive filler having a larger particle diameter include low soda alumina, aluminum nitride, and boron nitride. The thermally conductive filler having a larger particle diameter and including at least one selected from the group consisting of low soda alumina, aluminum nitride, and boron nitride is preferable, and the low soda alumina is particularly preferable.

Note that the low soda alumina contains soluble sodium in an amount of preferably not greater than 100 ppm, more preferably 40 ppm, and further preferably not greater than 20 ppm. Herein, the soluble sodium amount refers to an amount of sodium ions ($Na^+$) dissolved in water when the low soda alumina is brought into contact with water.

Examples of commercially available low soda alumina include trade name "AS-05" (available from Showa Denko K.K., particle diameter: 44 μm, soluble sodium amount: 2 ppm), trade name "CB-40" (available from Showa Denko K.K., particle diameter: 44 μm, soluble sodium amount: 20 ppm), trade name "AZ75-150" (available from NIPPON STEEL & SUMIKIN MATERIALS CO., LTD., particle diameter: 72 μm, soluble sodium amount: 10 ppm), and trade name "AZ35-125" (available from NIPPON STEEL & SUMIKIN MATERIALS CO., LTD., particle diameter: 35 μm, soluble sodium amount: 6 ppm).

The thermally conductive filler having a smaller particle diameter includes a thermally conductive filler having a particle diameter of not greater than 10 μm. The thermally conductive filler having a smaller particle diameter has a substantially spherical shape. The particle diameter of the thermally conductive filler having a smaller particle diameter is represented by an average particle diameter $D_{50}$ determined by a laser diffraction process or the like. A specific example of the thermally conductive filler having a smaller particle diameter includes silicon carbide.

Examples of commercially available silicon carbide include trade name "GC #2500" (particle diameter: 5.5 μm), trade name "GC #1000" (particle diameter: 10 μm), trade name "GC #3000" (particle diameter: 4 μm), trade name "GC #6000" (particle diameter: 2 μm), and trade name "GCF180" (particle diameter: 63 μm) (all available from Showa Denko K.K.).

A total filling amount of the thermally conductive filler having a larger particle diameter and the thermally conductive filler having a smaller particle diameter relative to the whole volume of the thermally conductive member is from 50 to 60 vol. %.

For example, a content (mass %) of the thermally conductive filler having a larger particle diameter relative to the whole mass of the thermally conductive member is preferably from 31 to 75%, and more preferably from 38 to 72%. Moreover, a content (mass %) of the thermally conductive filler having a smaller particle diameter relative to the whole mass of the thermally conductive member is preferably from 10 to 39%, and more preferably from 10 to 38%.

Moreover, a filling ratio by volume of the thermally conductive filler having a larger particle diameter to the thermally conductive filler having a smaller particle diameter is preferably from 2:3 to 4:1.

As the mica, mica having a particle diameter of not greater than 10 μm and an aspect ratio of not greater than 50 is used. The mica is added to the silicone resin as an additive other than the thermally conductive filler having a larger particle diameter and the thermally conductive filler having a smaller particle diameter.

The mica has a flat shape. The "particle diameter" of the mica is represented by a volume average particle diameter Dv determined by a laser diffraction process or the like. Note that the particle diameter of the mica is preferably not greater than 8 μm. Moreover, the aspect ratio of the mica is preferably not greater than 30.

The mica is added at a ratio from 0.9 to 11 parts by mass, and preferably from 0.9 to 6 parts by mass relative to 100 parts by mass of the silicone resin.

Note that for example, a content (mass %) of the mica relative to the whole mass of the thermally conductive member is preferably from 0.13 to 1.76 mass %, and more preferably from 0.13 to 3.23 mass %.

Examples of commercially available silicon carbide include trade name "SJ-005" (particle diameter: 5 μm, aspect ratio: 20), trade name "SJ-010" (particle diameter: 5 μm, aspect ratio: 20), and trade name "A-11" (particle diameter: 3 μm) (all available from YAMAGUCHI MICA CO., LTD.), and trade name "MK-100" (particle diameter: 4.5 μm, aspect ratio: 40, available from Katakura & Co-op Agri Corporation).

A method for producing a thermally conductive member includes a mixture preparing step of adding and mixing a thermally conductive filler having a larger particle diameter from 30 μm to 100 μm, a thermally conductive filler having a smaller particle diameter of not greater than 10 μm, and mica having a particle diameter of not greater than 10 μm and an aspect ratio of not greater than 50 into an uncured silicone resin, to obtain a mixture, and a curing step of curing the mixture to obtain a thermally conductive member including a cured product of the mixture.

In the mixture preparing step, an additive other than the thermally conductive filler having a larger particle diameter, the thermally conductive filler having a smaller particle diameter, and the mica may be added, as necessary.

When the silicone resin is a thermosetting silicone resin, the mixture is heated in the curing step. When the silicone resin is a photocuring silicone resin, the mixture is irradiated with an active energy ray such as ultraviolet light in the curing step.

Note that between the mixture preparing step and the curing step, the method may include a molding step of molding the mixture in a predetermined shape. The molding step is a step of filling a predetermined mold with the mixture or using a coater or the like to mold the mixture in a predetermined shape (for example, a layer shape (sheet shape)). In the molding step, a known molding method such as a molding method using a coating device such as a coater, and a molding method using a molding mold can be applied.

Note that from a viewpoint of ease of production of a thin sheet, favorable productivity (in particular, mass productivity), high thickness precision of a sheet, and the like, the molding step is preferably a molding step using a coater.

The thermally conductive member has excellent dielectric breakdown strength even under a high-temperature condition. Specifically, the dielectric breakdown strength obtained after a high-temperature acceleration test in which the thermally conductive member is left under a temperature condition of 275° C. for 100 hours is not less than 5 kV/mm.

Note that volume resistivity (Ω·cm) of the thermally conductive member is approximately $5.9 \times 10^{12}$ Ω·cm before heating, and approximately $5.4 \times 10^{13}$ Ω·cm after the high-temperature acceleration test.

The thermally conductive member of the present invention has excellent thermal resistance. The thermally conductive member can be applied to a high-temperature heating element such as a SiC power semiconductor, and the like.

Hereinafter, the present invention will be described in detail based on Examples. Note that the present invention is not limited to these Examples in any manner.

Investigation of Various Kinds of Fillers

Example 1

As a silicone resin, a two-part curing silicone resin (trade name "CY52-276A/B" available from Dow Corning Toray Co., Ltd., viscosity: 1 Pa·s (before curing)) was prepared. Moreover, as a thermally conductive filler having a larger particle diameter, low soda alumina (trade name "AZ75-150" available from NIPPON STEEL & SUMIKIN MATERIALS CO., LTD., particle diameter: 72 μm, soluble sodium amount: 10 ppm) was prepared. As a thermally conductive filler having a smaller particle diameter, silicon carbide (trade name "GC #2500" available from Showa Denko K.K., particle diameter: 5.5 μm) was prepared. Moreover, as an additive other than the aforementioned additives, mica (trade name "SJ-005" available from YAMAGUCHI MICA CO., LTD., particle diameter: 5 μm, aspect ratio: 20) was prepared.

Then, to a liquid silicone resin uncured, the low soda alumina, the silicon carbide, and the mica were each added under the following addition conditions.

The thermally conductive filler having a larger particle diameter (low soda alumina) and the thermally conductive filler having a smaller particle diameter (silicon carbide) were added to the liquid silicone resin to result in a total filling amount of the thermally conductive filler having a larger particle diameter and the thermally conductive filler having a smaller particle diameter of 55 vol. % and a filling ratio by volume of the thermally conductive filler having a larger particle diameter to the thermally conductive filler having a smaller particle diameter of 3:2.

Moreover, in addition to the low soda alumina and the silicon carbide, the mica was added to the liquid silicone resin at a ratio of 2 mass % relative to the silicone resin.

The low soda alumina, the silicon carbide, the mica, and the silicone resin were kneaded, to obtain a mixture having fluidity. A predetermined mold was filled with the mixture, and the mixture was heated in this state to be cured. Subsequently, the mixture was appropriately cooled, and a cured product of the mixture was removed from the mold, to obtain a sheet-shaped thermally conductive member of Example 1.

Comparative Example 1

A sheet-shaped thermally conductive member was obtained in the same manner as in Example 1 except that as a thermally conductive filler having a larger particle diameter, alumina of a standard grade (trade name "AX75-150" available from NIPPON STEEL & SUMIKIN MATERIALS CO., LTD., particle diameter: 72 μm, soluble sodium amount: 150 ppm) was used instead of low soda alumina as shown in Table 1. Note that in Table 1 and the like, the thermally conductive filler having a larger particle diameter is represented by "larger particle" and the thermally conductive filler having a smaller particle diameter is represented by "smaller particle".

Comparative Example 2

A sheet-shaped thermally conductive member was obtained in the same manner as in Example 1 except that mica was not added.

Comparative Example 3

A sheet-shaped thermally conductive member was obtained in the same manner as in Comparative Example 1 except that mica was not added.

Comparative Example 4

A sheet-shaped thermally conductive member was obtained in the same manner as in Example 1 except that as a thermally conductive filler having a larger particle diameter, silicon carbide (trade name "GCF180" available from Showa Denko K.K., particle diameter: 63 μm) was used instead of low soda alumina and mica was not added as shown in Table 1.

Comparative Example 5

A sheet-shaped thermally conductive member was obtained in the same manner as in Example 1 except that as a thermally conductive filler having a larger particle diameter, silicon carbide (trade name "GCF180" available from Showa Denko K.K., particle diameter: 63 μm) was used instead of low soda alumina as shown in Table 1.

Comparative Example 6

A sheet-shaped thermally conductive member was obtained in the same manner as in Example 1 except that as a thermally conductive filler having a larger particle diameter, silicon carbide (trade name "GCF180" available from Showa Denko K.K., particle diameter: 63 μm) was used instead of low soda alumina, and as a thermally conductive filler having a smaller particle diameter, low soda alumina (trade name "AZ2-75", particle diameter: 4 μm, soluble sodium amount: 4 ppm) was used instead of silicon carbide, and that mica was not added.

Comparative Example 7

A sheet-shaped thermally conductive member was obtained in the same manner as in Comparative Example 6 except that mica was not added.

Comparative Example 8

A sheet-shaped thermally conductive member was obtained in the same manner as in Example 1 except that as mica, trade name "MK-300" available from Katakura & Co-op Agri Corporation, particle diameter: 12.4, aspect ratio: 150) was used and an addition amount of the mica was changed to 1 mass %.

Example 2

A sheet-shaped thermally conductive member was obtained in the same manner as in Example 1 except that an addition amount of the mica was changed to 10 mass %.

Comparative Example 9

A sheet-shaped thermally conductive member was obtained in the same manner as in Example 1 except that an addition amount of the mica was changed to 20 mass %.

Comparative Example 10

A sheet-shaped thermally conductive member was obtained in the same manner as in Example 1 except that boron nitride (trade name "UHB-S1" available from Showa Denko K.K., particle diameter: 0.5 μm, shape: flat shape) was used instead of the mica and an addition amount of the boron nitride was changed to 1 mass %.

Comparative Example 11

A sheet-shaped thermally conductive member was obtained in the same manner as in Example 1 except that as a thermally conductive filler having a larger particle diameter, silica (trade name "HS310" available from NIPPON STEEL & SUMIKIN MATERIALS CO., LTD., particle diameter: 75 μm) was used instead of low soda alumina and mica was not added.

Comparative Example 12

A sheet-shaped thermally conductive member was obtained in the same manner as in Example 1 except that as a thermally conductive filler having a larger particle diameter, silica (trade name "HS310" available from NIPPON STEEL & SUMIKIN MATERIALS CO., LTD., particle diameter: 75 μm) was used instead of low soda alumina.

Comparative Example 13

A sheet-shaped thermally conductive member was obtained in the same manner as in Example 1 except that as a thermally conductive filler having a larger particle diameter, aluminum nitride (trade name "HF-50" available from Tokuyama Corporation, particle diameter: 50 μm) was used instead of low soda alumina and mica was not added.

Example 3

A sheet-shaped thermally conductive member was obtained in the same manner as in Example 1 except that as a thermally conductive filler having a larger particle diameter, aluminum nitride (trade name "HF-50" available from Tokuyama Corporation, particle diameter: 50 μm) was used instead of low soda alumina.

Comparative Example 14

A sheet-shaped thermally conductive member was obtained in the same manner as in Example 1 except that as a thermally conductive filler having a larger particle diameter, boron nitride (trade name "PT-110" available from Momentive Performance Materials Japan LLC, particle diameter: 43 μm) was used instead of low soda alumina and mica was not added.

Example 4

A sheet-shaped thermally conductive member was obtained in the same manner as in Example 1 except that a thermally conductive filler having a larger particle diameter, boron nitride (trade name "PT-110" available from Momentive Performance Materials Japan LLC, particle diameter: 43 μm) was used instead of low soda alumina.

Comparative Example 15

A sheet-shaped thermally conductive member was obtained in the same manner as in Example 1 except that as a thermally conductive filler having a smaller particle diameter, low soda alumina (trade name "AZ2-75", particle diameter: 4 μm, soluble sodium amount: 4 ppm) was used instead of silicon carbide, and mica was not added.

Comparative Example 16

A sheet-shaped thermally conductive member was obtained in the same manner as in Example 1 except that as a thermally conductive filler having a smaller particle diameter, low soda alumina (trade name "AZ2-75", particle diameter: 4 μm, soluble sodium amount: 4 ppm) was used instead of silicon carbide.

TABLE 1

| | Total filling amount (vol. %) | Larger particle: smaller particle (Ratio by volume) | Larger particle Kind | Particle diameter (μm) |
|---|---|---|---|---|
| Example 1 | 55 | 3:2 | Low soda alumina (10 ppm) | 72 |
| Comparative Example 1 | 55 | 3:2 | Standard alumina (150 ppm) | 72 |
| Comparative Example 2 | 55 | 3:2 | Low soda alumina (10 ppm) | 72 |
| Comparative Example 3 | 55 | 3:2 | Standard alumina (150 ppm) | 72 |
| Comparative Example 4 | 55 | 3:2 | Silicon carbide | 63 |
| Comparative Example 5 | 55 | 3:2 | Silicon carbide | 63 |
| Comparative Example 6 | 55 | 3:2 | Silicon carbide | 63 |
| Comparative Example 7 | 55 | 3:2 | Silicon carbide | 63 |
| Comparative Example 8 | 55 | 3:2 | Low soda alumina (10 ppm) | 72 |
| Example 2 | 55 | 3:2 | Low soda alumina (10 ppm) | 72 |
| Comparative Example 9 | 55 | 3:2 | Low soda alumina (10 ppm) | 72 |

| | Smaller particle | | Additive | | | |
|---|---|---|---|---|---|---|
| | Kind | Particle diameter (μm) | Kind | Particle diameter (μm) | Aspect ratio | Addition amount (mass %) |
| Example 1 | Silicon carbide | 5.5 | Mica | 5 | 20 | 2 |
| Comparative Example 1 | Silicon carbide | 5.5 | Mica | 5 | 20 | 2 |
| Comparative Example 2 | Silicon carbide | 5.5 | None | | | |
| Comparative Example 3 | Silicon carbide | 5.5 | None | | | |

TABLE 1-continued

| | | | | | | |
|---|---|---|---|---|---|---|
| Comparative Example 4 | Silicon carbide | 5.5 | None | | | |
| Comparative Example 5 | Silicon carbide | 5.5 | Mica | 5 | 20 | 2 |
| Comparative Example 6 | Low soda alumina (4 ppm) | 4 | None | | | |
| Comparative Example 7 | Low soda alumina (4 ppm) | 4 | Mica | 5 | 20 | 2 |
| Comparative Example 8 | Silicon carbide | 5.5 | Mica | 12.4 | 150 | 1 |
| Example 2 | Silicon carbide | 5.5 | Mica | 5 | 20 | 10 |
| Comparative Example 9 | Silicon carbide | 5.5 | Mica | 5 | 20 | 20 |

TABLE 2

| | Total filling amount (vol. %) | Larger particle: smaller particle (Ratio by volume) | Larger particle Kind | Larger particle Particle diameter (μm) |
|---|---|---|---|---|
| Comparative Example 10 | 55 | 3:2 | Low soda alumina (10 ppm) | 72 |
| Comparative Example 11 | 55 | 3:2 | Silica | 75 |
| Comparative Example 12 | 55 | 3:2 | Silica | 75 |
| Comparative Example 13 | 55 | 3:2 | Aluminum nitride | 50 |
| Example 3 | 55 | 3:2 | Aluminum nitride | 50 |
| Comparative Example 14 | 55 | 3:2 | Boron nitride | 43 |
| Example 4 | 55 | 3:2 | Boron nitride | 43 |
| Comparative Example 15 | 55 | 3:2 | Low soda alumina (10 ppm) | 72 |
| Comparative Example 16 | 55 | 3:2 | Low soda alumina (10 ppm) | 72 |

| | Smaller particle | | Additive | | | |
|---|---|---|---|---|---|---|
| | Kind | Particle diameter (μm) | Kind | Particle diameter (μm) | Aspect ratio | Addition amount (mass %) |
| Comparative Example 10 | Silicon carbide | 5.5 | Boron nitride | 0.5 | | 1 |
| Comparative Example 11 | Silicon carbide | 5.5 | None | | | |
| Comparative Example 12 | Silicon carbide | 5.5 | Mica | 5 | 20 | 2 |
| Comparative Example 13 | Silicon carbide | 5.5 | None | | | |
| Example 3 | Silicon carbide | 5.5 | Mica | 5 | 20 | 2 |
| Comparative Example 14 | Silicon carbide | 5.5 | None | | | |
| Example 4 | Silicon carbide | 5.5 | Mica | 5 | 20 | 2 |
| Comparative Example 15 | Low soda alumina (4 ppm) | 4 | None | | | |
| Comparative Example 16 | Low soda alumina (4 ppm) | 4 | Mica | 5 | 20 | 2 |

Measurement and Evaluation of Initial Physical Properties

Measurement of Thermal Conductivity

Each of the thermally conductive members of Examples and Comparative Examples was subjected to processing such as cutting, to prepare a measurement sample (50 mm in length×70 mm in width×7 m in thickness). Thermal conductivity (W/m·k) of each of these measurement samples was measured in accordance with ISO 22007-2 by a hot disk method with use of a measurement device (product name "TPS-500" available from Kyoto Electronics Manufacturing Co., Ltd.).

Moreover, thermal conduction was evaluated in accordance with the following criteria from the measurement results of each measurement sample. The results are shown in Tables 3 and 4.

Evaluation Criteria of Thermal Conduction

"Excellent": The thermal conductivity is not less than 2 W/m·k, and the thermal conduction is particularly excellent.

"Good": The thermal conductivity is not less than 1.5 W/m·k, and the thermal conduction is excellent.

"Marginal": The thermal conductivity is not less than 1.0 W/m·k, and the thermal conduction is mostly excellent.

"Fail": The thermal conductivity is less than 1.0 W/m·k, and the thermal conduction is poor.

Measurement of Hardness

Each of the thermally conductive members of Examples and Comparative Examples was subjected to processing such as cutting, to prepare a measurement sample (50 mm in length×70 mm in width×7 m in thickness). Hardness of each of these measurement samples was measured in accordance with JISK7312 with use of a rubber hardness meter (durometer, ASKER C available from KOBUNSHI KEIKI CO., LTD.). The results are shown in Tables 3 and 4.

Measurement of Dielectric Breakdown Strength

Each of the thermally conductive members of Examples and Comparative Examples was subjected to processing such as cutting, to prepare a measurement sample (50 mm in length×50 mm in width×1 m in thickness). Dielectric breakdown strength (kV/mm) of each of these measurement samples was measured in accordance with JISC2110-1 with use of a voltage resistance measurement device (product name "TOS5101" available from KIKUSUI ELECTRONICS CORPORATION).

Moreover, the dielectric breakdown strength was evaluated in accordance with the following criteria from the measurement results of each measurement sample. The results are shown in Tables 3 and 4.

Evaluation Criteria of Dielectric Breakdown Strength

"Good": The dielectric breakdown strength is not less than 5 kV/mm, and the insulating properties are excellent.

"Fail": The dielectric breakdown strength is less than 5 kV/mm, and the insulating properties are poor.

Measurement and Evaluation of Physical Properties Obtained After Thermal Resistance Test Measurement of Dielectric Breakdown Strength Each of the thermally conductive members of Examples and Comparative Examples was subjected to processing such as cutting, to prepare a measurement sample (50 mm in length×50 mm in width×1 m in thickness). Each of these measurement samples was placed in a heating device, and left under a temperature condition of 275° C. for 100 hours. Thus, a thermal resistance test was carried out. Subsequently, each measurement sample was removed from the heating device, and appropriately cooled. The dielectric breakdown strength (kV/mm) of each measurement sample heat-treated as described above was measured in the same manner as in the case of the measurement of the initial physical properties. Moreover, the dielectric breakdown strength of each measurement sample subjected to the thermal resistance test was evaluated in the same manner as in the case of the evaluation of the initial physical properties. The results are shown in Tables 3 and 4.

Measurement of Weight Reduction Ratio

Each of the thermally conductive members of Examples and Comparative Examples was subjected to processing such as cutting, to prepare a measurement sample (50 mm in length×70 mm in width×7 m in thickness). Mass of each of these measurement samples was measured with used of a meter in advance. A value thus obtained was assumed to be mass obtained before the thermal resistance test. Subsequently, in the same manner as in the thermal resistance test described above, each measurement sample was subjected to heating treatment in which each measurement sample was left under a temperature condition of 275° C. for 100 hours. Subsequently, each measurement sample was appropriately cooled to room temperature, and mass of each measurement sample was measured with use of the same meter. A value thus obtained was assumed to be mass obtained after the thermal resistance test. Then, a weight reduction ratio (mass %) of weights obtained before and after the thermal resistance test of each measurement sample was determined by Equation 1 described below. The results are shown in Tables 3 and 4.

Weight reduction ratio (%)=(mass obtained before thermal resistance test (g)−mass obtained after thermal resistance test (g))/mass obtained before thermal resistance test (g)×100     (Equation 1)

Moreover, heat stability was evaluated in accordance with the following criteria from the results of the weight reduction ratio of each measurement sample. The results are shown in Tables 3 and 4.

"Good": The weight reduction ratio is not greater than 1 mass %, and the heat stability is excellent.

"Fail": The weight reduction ratio is greater than 1 mass %, and the heat stability is poor.

Evaluation of Appearance Obtained After Thermal Resistance Test

Appearance of each measurement sample subjected to the thermal resistance test and used in the measurement of the weight reduction ratio was visually evaluated in accordance with the following criteria. The results are shown in Tables 3 and 4.

Evaluation Criteria of Appearance

"Good": Cracking or foaming does not occur, and an increase in hardness of a surface is not confirmed.

"Marginal": A slight impression of foaming is confirmed, but the appearance is generally maintained.

"Fail": Cracking and foaming occur, or the hardness of a surface is increased.

Measurement of Hardness Obtained After Thermal Resistance Test

Hardness of each measurement sample subjected to the thermal resistance test and used in the measurement of the weight reduction ratio was measured in the same manner as in the case of the measurement of the initial physical properties. The results are shown in Tables 3 and 4.

Processability

Ease of production (processability) of each of the thermally conductive members of Examples and Comparative Examples was evaluated in accordance with the following criteria. The results are shown in Tables 3 and 4.

"Good": Molding can be achieved without problems.

"Fail": Viscosity of a silicone resin composition is too high, and molding cannot be achieved.

Comprehensive Evaluation

Each of the thermally conductive members of Examples and Comparative Examples was comprehensively evaluated in accordance with the following criteria. The results are shown in Tables 3 and 4.

Comprehensive Evaluation Criteria

"Excellent": All the evaluation results are "good" or "excellent".

"Good": There no "poor" evaluation result and there is not less than one "marginal" evaluation result.

"Fail": There is not less than one "poor" evaluation result.

TABLE 3

| | Initial physical properties | | | | |
| --- | --- | --- | --- | --- | --- |
| | Thermal conductivity | | Dielectric breakdown strength | | |
| | Evaluation | Value (W/m·K) | Evaluation | Value (kV/mm) | Hardness ASKER C |
| Example 1 | Good | 1.8 | Good | 7.68 | 42 |
| Comparative Example 1 | Good | 1.8 | Good | 6.50 | 40 |
| Comparative Example 2 | Good | 1.9 | Good | 6.95 | 44 |
| Comparative Example 3 | Good | 1.9 | Good | 5.18 | 40 |
| Comparative Example 4 | Excellent | 2.2 | Fail | 0.69 | 48 |
| Comparative Example 5 | Excellent | 2.2 | Fail | 0.75 | 48 |
| Comparative Example 6 | Good | 1.9 | Fail | 1.41 | 30 |
| Comparative Example 7 | Good | 1.9 | Fail | 1.60 | 30 |
| Comparative Example 8 | Good | 1.8 | Good | 5.77 | 50 |
| Example 2 | Good | 1.8 | Good | 7.81 | 46 |
| Comparative Example 9 | Good | 1.7 | Good | 8.00 | 45 |

| | Physical properties obtained after thermal resistance test (at 275° C. for 100 hours) | | | | | |
| --- | --- | --- | --- | --- | --- | --- |
| | Dielectric breakdown strength | | Weight reduction ratio | | | |
| | Evaluation | Value (kV/mm) | Evaluation | Value (mass %) | Appearance Evaluation | Hardness ASKER C |
| Example 1 | Good | 6.74 | Good | 0.70 | Good | 50 |
| Comparative Example 1 | Good | 5.60 | Fail | 1.42 | Good | 52 |

TABLE 3-continued

|  |  |  |  |  |  |  |
|---|---|---|---|---|---|---|
| Comparative Example 2 | Fail | 4.77 | Good | 0.87 | Good | 62 |
| Comparative Example 3 | Fail | 3.41 | Fail | 1.77 | Good | 58 |
| Comparative Example 4 | Fail | 0.63 | Good | 0.59 | Good | 50 |
| Comparative Example 5 | Fail | 0.72 | Good | 0.60 | Good | 50 |
| Comparative Example 6 | Fail | 1.00 | Fail | 3.03 | Fail | 75 |
| Comparative Example 7 | Fail | 1.30 | Fail | 3.00 | Fail | 75 |
| Comparative Example 8 | Fail | 4.36 | Good | 0.83 | Good | 70 |
| Example 2 | Good | 7.77 | Good | 0.92 | Marginal | 45 |
| Comparative Example 9 | Good | 7.80 | Good | 0.95 | Marginal | 45 |

|  | Processability | Comprehensive evaluation |
|---|---|---|
| Example 1 | Good | Excellent |
| Comparative Example 1 | Good | Fail |
| Comparative Example 2 | Good | Fail |
| Comparative Example 3 | Good | Fail |
| Comparative Example 4 | Good | Fail |
| Comparative Example 5 | Good | Fail |
| Comparative Example 6 | Good | Fail |
| Comparative Example 7 | Good | Fail |
| Comparative Example 8 | Good | Fail |
| Example 2 | Good | Good |
| Comparative Example 9 | Fail | Fail |

TABLE 4

|  | Initial physical properties | | | | |
|---|---|---|---|---|---|
|  | Thermal conductivity | | Dielectric breakdown strength | | |
|  | Evaluation | Value (W/m · K) | Evaluation | Value (kV/mm) | Hardness ASKER C |
| Comparative Example 10 | Good | 1.8 | Good | 6.68 | 43 |
| Comparative Example 11 | Fail | 0.9 | Good | 5.50 | 45 |
| Comparative Example 12 | Fail | 0.9 | Good | 6.90 | 45 |
| Comparative Example 13 | Excellent | 2.2 | Good | 6.90 | 41 |
| Example 3 | Excellent | 2.2 | Good | 7.68 | 45 |
| Comparative Example 14 | Excellent | 2.1 | Good | 6.90 | 41 |
| Example 4 | Excellent | 2.1 | Good | 7.68 | 45 |
| Comparative Example 15 | Good | 1.6 | Good | not less than 10 | 37 |
| Comparative Example 16 | Good | 1.6 | Good | not less than 10 | 35 |

|  | Physical properties obtained after thermal resistance test (at 275° C. for 100 hours) | | | | | |
|---|---|---|---|---|---|---|
|  | Dielectric breakdown strength | | Weight reduction ratio | | | |
|  | Evaluation | Value (kV/mm) | Evaluation | Value (mass %) | Appearance Evaluation | Hardness ASKER C |
| Comparative Example 10 | Fail | 4.48 | Good | 0.96 | Good | 68 |
| Comparative Example 11 | Fail | 4.30 | Good | 0.85 | Good | 63 |
| Comparative Example 12 | Good | 6.50 | Good | 0.85 | Good | 63 |
| Comparative Example 13 | Fail | 4.70 | Good | 0.75 | Good | 55 |
| Example 3 | Good | 6.74 | Good | 0.75 | Good | 63 |
| Comparative Example 14 | Fail | 4.70 | Good | 0.80 | Good | 55 |

TABLE 4-continued

| | | | | | | |
|---|---|---|---|---|---|---|
| Example 4 | Good | 6.74 | Good | 0.80 | Good | 63 |
| Comparative Example 15 | Good | not less than 10 | Fail | 2.06 | Fail | 84 |
| Comparative Example 16 | Good | not less than 10 | Fail | 2.00 | Fail | 82 |

| | Processability | Comprehensive evaluation |
|---|---|---|
| Comparative Example 10 | Good | Fail |
| Comparative Example 11 | Good | Fail |
| Comparative Example 12 | Good | Fail |
| Comparative Example 13 | Good | Fail |
| Example 3 | Good | Excellent |
| Comparative Example 14 | Good | Fail |
| Example 4 | Good | Excellent |
| Comparative Example 15 | Good | Fail |
| Comparative Example 16 | Good | Fail |

As shown in Tables 3 and 4, the thermally conductive members of Examples 1 to 4 were confirmed to have excellent thermal resistance.

Investigation of Total Filling Amount and Filling Ratio of Fillers Having Larger and Smaller Particle Diameters Examples 5 to 14 and Comparative Examples 17 to 31

Sheet-shaped thermally conductive members according to Examples 5 to 14 and Comparative Examples 17 to 31 were each produced in the same manner as in Example 1 with use of the same silicone resin (trade name "CY52-276A/B" available from Dow Corning Toray Co., Ltd., viscosity: 1 Pa·s (before curing)) as in Example 1 under respective conditions of "thermally conductive filler having a larger particle diameter (larger particle)", "thermally conductive filler having a smaller particle diameter (smaller particle)", "total filling amount (of larger and smaller particles) (vol. %)", "larger particle:smaller particle (ratio by volume)", "additive (kind, particle diameter, aspect ratio, addition amount", as shown in Tables 5 to 7.

Note that in Tables 5 to 7, a part of Examples and Comparative Examples described above is shown together for the sake of convenience of description.

Measurement, Evaluation, and the Like of Initial Physical Properties and Physical Properties Obtained After Thermal Resistance Test Measurement and evaluation of initial physical properties (thermal conductivity, dielectric breakdown strength, and hardness), measurement and evaluation of physical properties obtained after a thermal resistance test (dielectric breakdown strength, weight reduction ratio (heat stability), and appearance), processability, and comprehensive evaluation were carried out for the thermally conductive members of Examples 5 to 14 and Comparative Examples 17 to 31. The results are shown in Tables 8 to 10.

TABLE 5

| | Total filling amount (vol. %) | Larger particle: smaller particle (Ratio by volume) | Larger particle Kind | Particle diameter (μm) |
|---|---|---|---|---|
| Comparative Example 17 | 55 | 1:2 | Low soda alumina (10 ppm) | 72 |
| Comparative Example 18 | 55 | 2:3 | Low soda alumina (10 ppm) | 72 |
| Comparative Example 19 | 55 | 1:1 | Low soda alumina (10 ppm) | 72 |
| Comparative Example 20 | 55 | 4:3 | Low soda alumina (10 ppm) | 72 |
| Comparative Example 2 | 55 | 3:2 | Low soda alumina (10 ppm) | 72 |
| Comparative Example 21 | 55 | 2:1 | Low soda alumina (10 ppm) | 72 |
| Comparative Example 22 | 55 | 4:1 | Low soda alumina (10 ppm) | 72 |
| Comparative Example 23 | 55 | 8:1 | Low soda alumina (10 ppm) | 72 |
| Comparative Example 24 | 50 | 3:2 | Low soda alumina (10 ppm) | 72 |
| Comparative Example 25 | 40 | 3:2 | Low soda alumina (10 ppm) | 72 |
| Comparative Example 26 | 60 | 3:2 | Low soda alumina (10 ppm) | 72 |
| Comparative Example 27 | 60 | 2:1 | Low soda alumina (10 ppm) | 72 |

TABLE 5-continued

| | Smaller particle | | Additive | | | |
|---|---|---|---|---|---|---|
| | Kind | Particle diameter (μm) | Kind | Particle diameter (μm) | Aspect ratio | Addition amount (mass %) |
| Comparative Example 17 | Silicon carbide | 5.5 | None | | | |
| Comparative Example 18 | Silicon carbide | 5.5 | None | | | |
| Comparative Example 19 | Silicon carbide | 5.5 | None | | | |
| Comparative Example 20 | Silicon carbide | 5.5 | None | | | |
| Comparative Example 2 | Silicon carbide | 5.5 | None | | | |
| Comparative Example 21 | Silicon carbide | 5.5 | None | | | |
| Comparative Example 22 | Silicon carbide | 5.5 | None | | | |
| Comparative Example 23 | Silicon carbide | 5.5 | None | | | |
| Comparative Example 24 | Silicon carbide | 5.5 | None | | | |
| Comparative Example 25 | Silicon carbide | 5.5 | None | | | |
| Comparative Example 26 | Silicon carbide | 5.5 | None | | | |
| Comparative Example 27 | Silicon carbide | 5.5 | None | | | |

TABLE 6

| | Total filling amount (vol. %) | Larger particle: smaller particle (Ratio by volume) | Larger particle Kind | Particle diameter (μm) | Smaller particle Kind | Particle diameter (μm) | Additive Kind | Particle diameter (μm) | Aspect ratio | Addition amount (mass %) |
|---|---|---|---|---|---|---|---|---|---|---|
| Comparative Example 28 | 55 | 1:2 | Low soda alumina (10 ppm) | 72 | Silicon carbide | 5.5 | Mica | 5 | 20 | 2 |
| Example 5 | 55 | 2:3 | Low soda alumina (10 ppm) | 72 | Silicon carbide | 5.5 | Mica | 5 | 20 | 2 |
| Example 6 | 55 | 1:1 | Low soda alumina (10 ppm) | 72 | Silicon carbide | 5.5 | Mica | 5 | 20 | 2 |
| Example 7 | 55 | 4:3 | Low soda alumina (10 ppm) | 72 | Silicon carbide | 5.5 | Mica | 5 | 20 | 2 |
| Example 1 | 55 | 3:2 | Low soda alumina (10 ppm) | 72 | Silicon carbide | 5.5 | Mica | 5 | 20 | 2 |
| Example 8 | 55 | 2:1 | Low soda alumina (10 ppm) | 72 | Silicon carbide | 5.5 | Mica | 5 | 20 | 2 |
| Example 9 | 55 | 4:1 | Low soda alumina (10 ppm) | 72 | Silicon carbide | 5.5 | Mica | 5 | 20 | 2 |
| Comparative Example 29 | 55 | 8:1 | Low soda alumina (10 ppm) | 72 | Silicon carbide | 5.5 | Mica | 5 | 20 | 2 |
| Example 10 | 50 | 3:2 | Low soda alumina (10 ppm) | 72 | Silicon carbide | 5.5 | Mica | 5 | 20 | 2 |
| Example 11 | 40 | 3:2 | Low soda alumina (10 ppm) | 72 | Silicon carbide | 5.5 | Mica | 5 | 20 | 2 |
| Example 12 | 60 | 3:2 | Low soda alumina (10 ppm) | 72 | Silicon carbide | 5.5 | Mica | 5 | 20 | 2 |
| Example 13 | 60 | 2:1 | Low soda alumina (10 ppm) | 72 | Silicon carbide | 5.5 | Mica | 5 | 20 | 2 |

TABLE 7

| | Total filling amount (vol. %) | Larger particle: smaller particle (Ratio by volume) | Larger particle Kind | Particle diameter (μm) |
|---|---|---|---|---|
| Example 14 | 55 | 3:2 | Low soda alumina (10 ppm) | 72 |

TABLE 7-continued

| | | | | |
|---|---|---|---|---|
| Comparative Example 30 | 55 | 3:2 | Low soda alumina (10 ppm) | 72 |
| Comparative Example 31 | 55 | 3:2 | Low soda alumina (10 ppm) | 72 |
| Example 2 | 55 | 3:2 | Low soda alumina (10 ppm) | 72 |
| Comparative Example 8 | 55 | 3:2 | Low soda alumina (10 ppm) | 72 |

TABLE 7-continued

| | Smaller particle | | Additive | | | |
|---|---|---|---|---|---|---|
| | Kind | Particle diameter (μm) | Kind | Particle diameter (μm) | Aspect ratio | Addition amount (mass %) |
| Example 14 | Silicon carbide | 5.5 | Mica | 5 | 20 | 1 |
| Comparative Example 30 | Silicon carbide | 5.5 | Mica | 5 | 20 | 0.2 |
| Comparative Example 31 | Silicon carbide | 5.5 | Mica | 5 | 20 | 0.8 |
| Example 2 | Silicon carbide | 5.5 | Mica | 5 | 20 | 10 |
| Comparative Example 8 | Silicon carbide | 5.5 | Mica | 12.4 | 150 | 1 |

TABLE 8

| | Initial physical properties | | | | |
|---|---|---|---|---|---|
| | Thermal conductivity | | Dielectric breakdown strength | | Hardness |
| | Evaluation | Value (W/m · K) | Evaluation | Value (kV/mm) | ASKER C |
| Comparative Example 17 | | | Not evaluated | | |
| Comparative Example 18 | Good | 1.9 | Fail | 4.85 | 52 |
| Comparative Example 19 | Excellent | 2.0 | Fail | 4.47 | 53 |
| Comparative Example 20 | Good | 1.9 | Good | 5.43 | 49 |
| Comparative Example 2 | Good | 1.9 | Good | 6.95 | 44 |
| Comparative Example 21 | Good | 1.9 | Good | 5.30 | 50 |
| Comparative Example 22 | Good | 1.7 | Good | 5.66 | 49 |
| Comparative Example 23 | Good | 1.6 | Good | 5.50 | 45 |
| Comparative Example 24 | Good | 1.5 | Good | 5.29 | 43 |
| Comparative Example 25 | Marginal | 1.0 | Good | 5.80 | 35 |
| Comparative Example 26 | Excellent | 2.3 | Fail | 4.16 | 60 |
| Comparative Example 27 | Excellent | 2.2 | Fail | 4.86 | 62 |

| | Physical properties obtained after thermal resistance test (at 275° C. for 100 hours) | | | | | |
|---|---|---|---|---|---|---|
| | Dielectric breakdown strength | | Weight reduction ratio | | | |
| | Evaluation | Value (kV/mm) | Evaluation | Value (mass %) | Appearance Evaluation | Hardness ASKER C |
| Comparative Example 17 | | | Not evaluated | | | |
| Comparative Example 18 | Fail | 4.14 | Good | 0.72 | Good | 65 |
| Comparative Example 19 | Fail | 4.40 | Good | 0.82 | Good | 67 |
| Comparative Example 20 | Fail | 4.63 | Good | 0.81 | Good | 69 |
| Comparative Example 2 | Fail | 4.77 | Good | 0.87 | Good | 62 |
| Comparative Example 21 | Fail | 4.41 | Good | 0.71 | Good | 58 |
| Comparative Example 22 | Fail | 4.90 | Good | 0.86 | Good | 65 |
| Comparative Example 23 | Good | 5.10 | Fail | 1.01 | Fail | 75 |
| Comparative Example 24 | Fail | 4.55 | Good | 0.85 | Good | 65 |
| Comparative Example 25 | Fail | 4.90 | Good | 1.00 | Good | 60 |
| Comparative Example 26 | Fail | 4.00 | Good | 0.76 | Good | 78 |
| Comparative Example 27 | Fail | 4.54 | Good | 0.74 | Good | 75 |

| | Processability | Comprehensive evaluation |
|---|---|---|
| Comparative Example 17 | Fail | Fail |
| Comparative Example 18 | Good | Fail |
| Comparative Example 19 | Good | Fail |

TABLE 8-continued

| | | |
|---|---|---|
| Comparative Example 20 | Good | Fail |
| Comparative Example 2 | Good | Fail |
| Comparative Example 21 | Good | Fail |
| Comparative Example 22 | Good | Fail |
| Comparative Example 23 | Good | Fail |
| Comparative Example 24 | Good | Fail |
| Comparative Example 25 | Good | Fail |
| Comparative Example 26 | Good | Fail |
| Comparative Example 27 | Good | Fail |

TABLE 9

| | Initial physical properties | | | | |
|---|---|---|---|---|---|
| | Thermal conductivity | | Dielectric breakdown strength | | Hardness |
| | Evaluation | Value (W/m · K) | Evaluation | Value (kV/mm) | ASKER C |
| Comparative Example 28 | Not evaluated | | | | |
| Example 5 | Good | 1.9 | Good | 5.60 | 48 |
| Example 6 | Good | 1.9 | Good | 5.60 | 50 |
| Example 7 | Good | 1.8 | Good | 6.50 | 47 |
| Example 1 | Good | 1.8 | Good | 7.68 | 42 |
| Example 8 | Good | 1.8 | Good | 6.40 | 48 |
| Example 9 | Good | 1.7 | Good | 6.20 | 45 |
| Comparative Example 29 | Good | 1.5 | Good | 6.50 | 45 |
| Example 10 | Good | 1.5 | Good | 6.50 | 40 |
| Example 11 | Marginal | 1.0 | Good | 7.20 | 35 |
| Example 12 | Excellent | 2.2 | Good | 5.43 | 59 |
| Example 13 | Excellent | 2.1 | Good | 5.89 | 53 |

| | Physical properties obtained after thermal resistance test (at 275° C. for 100 hours) | | | | | |
|---|---|---|---|---|---|---|
| | Dielectric breakdown strength | | Weight reduction ratio | | Appearance Evaluation | Hardness ASKER C |
| | Evaluation | Value (kV/mm) | Evaluation | Value (mass %) | | |
| Comparative Example 28 | Not evaluated | | | | | |
| Example 5 | Good | 5.00 | Good | 0.72 | Good | 61 |
| Example 6 | Good | 5.00 | Good | 0.82 | Good | 62 |
| Example 7 | Good | 5.60 | Good | 0.82 | Good | 65 |
| Example 1 | Good | 6.74 | Good | 0.70 | Good | 50 |
| Example 8 | Good | 5.40 | Good | 0.73 | Good | 56 |
| Example 9 | Good | 5.50 | Good | 0.85 | Good | 63 |
| Comparative Example 29 | Good | 6.00 | Fail | 1.01 | Fail | 74 |
| Example 10 | Good | 6.20 | Good | 0.88 | Good | 62 |
| Example 11 | Good | 7.00 | Good | 1.00 | Good | 60 |
| Example 12 | Good | 5.10 | Good | 0.76 | Good | 75 |
| Example 13 | Good | 5.40 | Good | 0.76 | Good | 70 |

| | Processability | Comprehensive evaluation |
|---|---|---|
| Comparative Example 28 | Fail | Fail |
| Example 5 | Good | Excellent |
| Example 6 | Good | Excellent |
| Example 7 | Good | Excellent |
| Example 1 | Good | Excellent |
| Example 8 | Good | Excellent |
| Example 9 | Good | Excellent |
| Comparative Example 29 | Good | Fail |
| Example 10 | Good | Excellent |
| Example 11 | Good | Good |
| Example 12 | Good | Excellent |
| Example 13 | Good | Excellent |

TABLE 10

| | Initial physical properties | | | | |
|---|---|---|---|---|---|
| | Thermal conductivity | | Dielectric breakdown strength | | |
| | Evaluation | Value (W/m · K) | Evaluation | Value (kV/mm) | Hardness ASKER C |
| Example 14 | Good | 1.8 | Good | 7.58 | 46 |
| Comparative Example 30 | Good | 1.8 | Good | 5.20 | 48 |
| Comparative Example 31 | Good | 1.8 | Good | 5.36 | 47 |
| Example 2 | Good | 1.8 | Good | 7.81 | 46 |
| Comparative Example 8 | Good | 1.7 | Good | 5.77 | 50 |

| | Physical properties obtained after thermal resistance test (at 275° C. for 100 hours) | | | | | |
|---|---|---|---|---|---|---|
| | Dielectric breakdown strength | | Weight reduction ratio | | | |
| | Evaluation | Value (kV/mm) | Evaluation | Value (mass %) | Appearance Evaluation | Hardness ASKER C |
| Example 14 | Good | 6.11 | Good | 0.78 | Good | 59 |
| Comparative Example 30 | Fail | 4.28 | Good | 0.61 | Good | 55 |
| Comparative Example 31 | Fail | 4.92 | Good | 0.67 | Good | 58 |
| Example 2 | Good | 7.77 | Good | 0.92 | Marginal | 45 |
| Comparative Example 8 | Fail | 4.86 | Good | 0.83 | Good | 70 |

| | Processability | Comprehensive evaluation |
|---|---|---|
| Example 14 | Good | Excellent |
| Comparative Example 30 | Good | Fail |
| Comparative Example 31 | Good | Fail |
| Example 2 | Good | Good |
| Comparative Example 8 | Good | Fail |

As shown in Tables 8 to 10, the thermally conductive members of Examples 5 to 14 were confirmed to have excellent thermal resistance.

REFERENCE SIGNS LIST

1 Thermally conductive member
2 Silicone resin
3 Thermally conductive filler having a larger particle diameter
4 Thermally conductive filler having a smaller particle diameter
5 Mica

The invention claimed is:

1. A thermally conductive member comprising:
a silicone resin;
a thermally conductive filler having a larger particle diameter from 30 μm to 100 μm;
a thermally conductive filler having a smaller particle diameter of not greater than 10 μm; and
a mica having a particle diameter of not greater than 10 μm and an aspect ratio of not greater than 50,
wherein the mica is added at a ratio of from 0.9 to 11 parts by mass relative to 100 parts by mass of the silicone resin.

2. The thermally conductive member according to claim 1,
wherein a total filling amount of the thermally conductive filler having a larger particle diameter and the thermally conductive filler having a smaller particle diameter relative to whole volume of the thermally conductive member is from 50 to 60 vol. %, and
a filling ratio by volume of the thermally conductive filler having a larger particle diameter to the thermally conductive filler having a smaller particle diameter is from 2:3 to 4:1.

3. The thermally conductive member according to claim 1,
wherein the thermally conductive filler having a smaller particle diameter includes silicon carbide.

4. The thermally conductive member according to claim 1,
wherein the thermally conductive filler having a larger particle diameter includes at least one selected from the group consisting of low soda alumina, aluminum nitride, and boron nitride.

5. The thermally conductive member according to claim 4,
wherein the low soda alumina contains soluble sodium in an amount of not greater than 100 ppm.

6. A method for producing a thermally conductive member comprising:
adding and mixing a thermally conductive filler having a larger particle diameter from 30 μm to 100 μm, a thermally conductive filler having a smaller particle diameter of not greater than 10 μm, and a mica having a particle diameter of not greater than 10 μm and an aspect ratio of not greater than 50 into an uncured silicone resin, to obtain a mixture; and curing the mixture to obtain a thermally conductive member including a cured product of the mixture.

7. The thermally conductive member according to claim 2, wherein the thermally conductive filler having a smaller particle diameter includes silicon carbide.

8. The thermally conductive member according to claim 2, wherein the thermally conductive filler having a larger particle diameter includes at least one selected from the group consisting of low soda alumina, aluminum nitride, and boron nitride.

9. The thermally conductive member according to claim 8, wherein the low soda alumina contains soluble sodium in an amount of not greater than 100 ppm.

10. The thermally conductive member according to claim 3, wherein the thermally conductive filler having a larger particle diameter includes at least one selected from the group consisting of low soda alumina, aluminum nitride, and boron nitride.

11. The thermally conductive member according to claim 10, wherein the low soda alumina contains soluble sodium in an amount of not greater than 100 ppm.

12. The thermally conductive member according to claim 7, wherein the thermally conductive filler having a larger particle diameter includes at least one selected from the group consisting of low soda alumina, aluminum nitride, and boron nitride.

13. The thermally conductive member according to claim 12, wherein the low soda alumina contains soluble sodium in an amount of not greater than 100 ppm.

\* \* \* \* \*